(12) United States Patent
Chen et al.

(10) Patent No.: US 12,068,199 B2
(45) Date of Patent: Aug. 20, 2024

(54) METHODS FOR FORMING FIN FIELD-EFFECT TRANSISTORS

(71) Applicant: Taiwan Semiconductor Manufacturing Co., Ltd., Hsinchu (TW)

(72) Inventors: Ryan Chia-Jen Chen, Hsinchu (TW); Yih-Ann Lin, Jhudong Township (TW); Chia Tai Lin, Taichung (TW); Chao-Cheng Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 18/306,855

(22) Filed: Apr. 25, 2023

(65) Prior Publication Data

US 2023/0260843 A1    Aug. 17, 2023

Related U.S. Application Data

(60) Continuation of application No. 17/239,965, filed on Apr. 26, 2021, now Pat. No. 11,670,552, which is a continuation of application No. 16/588,482, filed on Sep. 30, 2019, now Pat. No. 10,991,627, which is a
(Continued)

(51) Int. Cl.
| H01L 29/66 | (2006.01) |
| H01L 21/308 | (2006.01) |
| H01L 21/762 | (2006.01) |
| H01L 21/8234 | (2006.01) |
| H01L 27/088 | (2006.01) |

(52) U.S. Cl.
CPC .. *H01L 21/823431* (2013.01); *H01L 21/3081* (2013.01); *H01L 21/76232* (2013.01); *H01L 21/823481* (2013.01); *H01L 27/0886* (2013.01); *H01L 29/6681* (2013.01)

(58) Field of Classification Search
CPC ......... H01L 21/823431; H01L 21/3081; H01L 21/76205; H01L 21/76232; H01L 21/76224; H01L 21/76229; H01L 21/76283–76286; H01L 21/823481; H01L 27/0886; H01L 27/0924; H01L 27/10879; H01L 27/1211; H01L 29/0642; H01L 29/0649; H01L 29/0657; H01L 29/0676; H01L 29/41791; H01L 29/66795–66818; H01L 29/6681; H01L 29/7831;
(Continued)

(56) References Cited

U.S. PATENT DOCUMENTS

| 7,425,500 B2 | 9/2008 | Metz et al. |
| 7,534,686 B2 | 5/2009 | Lee et al. |

(Continued)

*Primary Examiner* — Natalia A Gondarenko
(74) *Attorney, Agent, or Firm* — Slater Matsil, LLP

(57) ABSTRACT

A method includes forming a patterned etching mask, which includes a plurality of strips, and etching a semiconductor substrate underlying the patterned etching mask to form a first plurality of semiconductor fins and a second plurality of semiconductor fins. The patterned etching mask is used as an etching mask in the etching. The method further includes etching the second plurality of semiconductor fins without etching the first plurality of semiconductor fins. An isolation region is then formed, and the first plurality of semiconductor fins has top portions protruding higher than a top surface of the isolation region.

20 Claims, 13 Drawing Sheets

Related U.S. Application Data division of application No. 16/024,220, filed on Jun. 29, 2018, now Pat. No. 10,957,600, which is a continuation of application No. 15/493,663, filed on Apr. 21, 2017, now Pat. No. 10,083,872, which is a division of application No. 13/452,516, filed on Apr. 20, 2012, now Pat. No. 9,633,905.

(58) Field of Classification Search
CPC ..... H01L 29/7846; H01L 29/785–7856; H01L 29/7858; H01L 2924/13067
USPC .......... 438/283, 296, 424, 300; 257/722, 67, 257/206, 390, 397, 401
See application file for complete search history.

(56) References Cited

U.S. PATENT DOCUMENTS

| | | |
|---|---|---|
| 7,719,043 B2 | 5/2010 | Yamagami |
| 7,812,375 B2 | 10/2010 | Lee et al. |
| 8,541,286 B2 | 9/2013 | Park |
| 8,853,037 B2 | 10/2014 | Cho |
| 2004/0266083 A1* | 12/2004 | Hareland ............ H01L 29/7843 257/E29.137 |
| 2005/0186746 A1 | 8/2005 | Lee et al. |
| 2006/0081895 A1 | 4/2006 | Lee et al. |
| 2007/0018215 A1 | 1/2007 | Sandhu et al. |
| 2008/0149984 A1 | 6/2008 | Chang et al. |
| 2008/0296702 A1 | 12/2008 | Lee et al. |
| 2010/0015778 A1 | 1/2010 | Lin et al. |
| 2010/0252886 A1 | 10/2010 | Tang et al. |
| 2011/0263094 A1 | 10/2011 | Lin et al. |
| 2012/0003810 A1 | 1/2012 | Hwang et al. |
| 2012/0074386 A1 | 3/2012 | Rachmady et al. |
| 2012/0168897 A1* | 7/2012 | Ma ................... H01L 21/76232 257/E21.549 |
| 2012/0202330 A1 | 8/2012 | Takeda et al. |
| 2013/0045580 A1 | 2/2013 | Cho |
| 2013/0065326 A1 | 3/2013 | Sudo |
| 2013/0196508 A1 | 8/2013 | LiCausi |

* cited by examiner

METHODS FOR FORMING FIN FIELD-EFFECT TRANSISTORS

PRIORITY CLAIM AND CROSS-REFERENCE

This application is a continuation of U.S. application Ser. No. 17/239,965, filed Apr. 26, 2021, now U.S. Pat. No. 11,670,552, issued June 6, 2023, which is a continuation of U.S. application Ser. No. 16/588,482, filed Sep. 30, 2019, now U.S. Pat. No. 10,991,627, issued Apr. 27, 2021, which is a divisional of U.S. patent application Ser. No. 16/024,220, filed Jun. 29, 2018, now U.S. Pat. No. 10,957,600, issued Mar. 23, 2021, which is a continuation of U.S. application Ser. No. 15/493,663, filed Apr. 21, 2017, now U.S. Pat. No. 10,083,872 issued Sep. 25, 2018, which is a divisional of U.S. application Ser. No. 13/452,516, filed Apr. 20, 2012, now U.S. Pat. No. 9,633,905 issued Apr. 25, 2017, which applications are incorporated herein by reference.

BACKGROUND

With the increasing down-scaling of integrated circuits and the increasingly demanding requirements to the speed of integrated circuits, transistors need to have higher drive currents with smaller dimensions. Fin Field-Effect Transistors (FinFET) were thus developed. FinFETs have increased channel widths. The increase in the channel width is achieved by forming channels that include portions on the sidewalls of the fins and portions on the top surfaces of the fins.

With the increasing down-scaling of integrated circuits, fins also become increasingly thinner, and the aspect ratios of the gaps between the fins become increasingly greater. The formation processes of the fins thus are more prone to the process variations in the respective manufacturing processes. In conventional FinFET manufacturing processes, the hard masks for forming the fins are defined first. The hard masks are then used as etching masks to etch the underlying semiconductor substrates, and the patterns of the hard masks are transferred to the underlying semiconductor substrates to from fins. In the etching of the semiconductor substrates, since the hard masks have pattern-dense regions and pattern-sparse regions, the pattern loading effect causes the fins in the pattern-dense regions and the pattern-sparse regions to be different from each other. The respective FinFETs are thus adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming semiconductor fins, which may be used for forming Fin Field-Effect Transistors (FinFETs), and the respective structures are provided in accordance with various exemplary embodiments. The intermediate stages of forming the semiconductor fins are illustrated. The variations of the embodiments are discussed. Throughout the various views and illustrative embodiments, like reference numbers are used to designate like elements.

Figure 1:
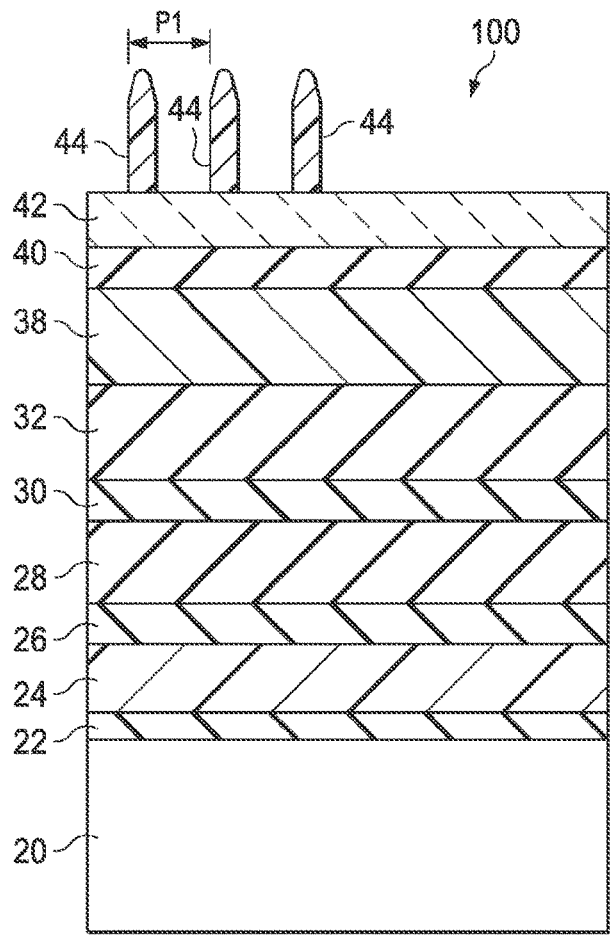
FIGS. 1 through 18 are cross-sectional views of intermediate stages in the manufacturing of Fin Field-Effect Transistors (FinFET) in accordance with some exemplary embodiments.

FIGS. 1 through 18 illustrate cross-sectional views of intermediate stages in the formation of semiconductor fins, isolation regions, and FinFETs in accordance with various embodiments. FIG. 1 illustrates wafer 100, which includes substrate 20 and overlying layers. Substrate 20 may be formed of a semiconductor material such as silicon, silicon germanium, or the like. In some embodiments, substrate 20 is a crystalline semiconductor substrate such as a crystalline silicon substrate. Pad oxide layer 22 and hard mask 24 are formed over substrate 20. In accordance with embodiments, pad oxide layer 22 comprises silicon oxide. Hard mask 24 may be formed of silicon nitride.

A plurality of layers is formed over hard mask 24. In some exemplary embodiments, the plurality of layers includes oxide layers 26 and 30, hard masks 28, 32, and 38, silicon oxynitride layer 40, and Bottom Anti-Reflective Coating (BARC) 42. It is appreciated that the layers illustrated in FIG. 1 is exemplary. In alternative embodiments, different layers may be formed over substrate 20, and the number of layers may also be different from what is shown in FIG. 1. Oxide layers 26 and 30 may be Plasma Enhanced (PE) oxides, which may be silicon oxide layers that are formed using Plasma Enhanced Chemical Vapor Deposition (PECVD). Hard mask 28 and 32 may comprise an Ashing Removable Dielectric (ARD) material, and hence is referred to as ARDs 28 and 32 hereinafter, although they may also be formed of other materials. In some embodiments, hard mask 38, which may also be an ARD, may include amorphous carbon. Silicon oxynitride layer 40 may be formed over hard mask 38. BARC 42 and silicon oxynitride layer 40 may be used for lithography purposes, for example, for reducing the reflection of the yellow light used in the exposure of the overlying photo resist 44.

Figure 2:
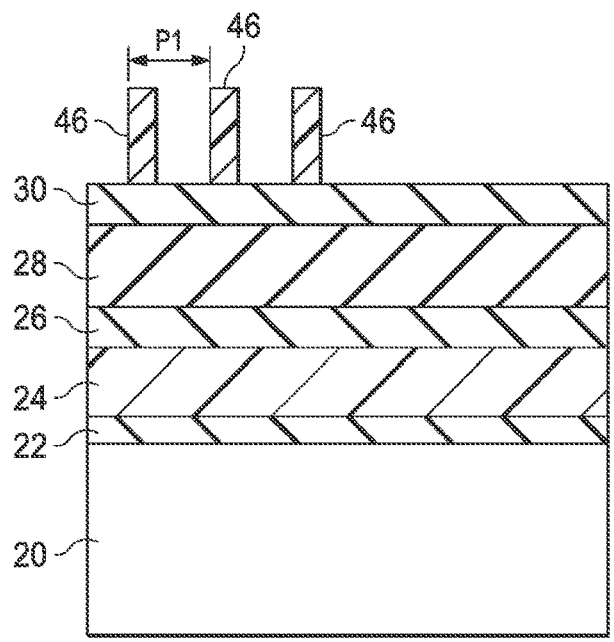

FIGS. 1 and 2 also illustrate a lithography process for patterning ARD 32. Photo resist 44 is formed over BARC 42, and is then patterned. Layers 32, 38, 40, 42, and photo resist 44 are used to form patterns with small pitches, which may be less than the minimum pitch allowed by the lithography process used for forming the integrated circuits. Layers 22, 26, 28, and 30 are used to transfer the small pitches to substrate 20. In some embodiments, the minimum pitch P1 of photo resist 44 may be close to, or equal to, the minimum pitch allowed by the technology for developing photo resist 44 and for performing the etch using photo resist 44 as an etching mask.

BARC 42, silicon oxynitride layer 40, and ARDs 38 and 32 are etched, for example, using plasma-assisted dry etching, followed by the removal of photo resist 44, BARC 42, and layers 40 and 38. The resulting structure is shown in FIG. 2. The remaining portions of hard mask 32 are referred to as mandrels 46 hereinafter. The pitches of mandrels 46 may be substantially equal to the respective pitch P1 of photo resist 44 (FIG. 1).

Figure 3:
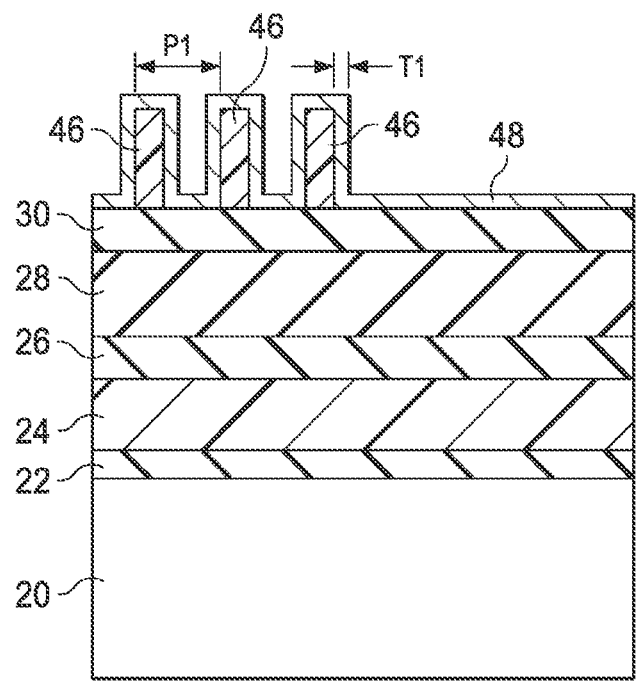

Next, as shown in FIG. 3, spacer layer 48 is deposited using a conformal deposition method. In some embodiments, spacer layer 48 is deposited using Atomic Layer Deposition (ALD), which may form a high quality film that has a low etching rate. The ALD may be performed using DiChloroSilane (DCS) and ammonia as precursors, and the resulting spacer layer 48 may include silicon nitride or silicon-rich nitride. In alternative embodiments, other conformal deposition methods, such as Low-Pressure Chemical Vapor Deposition (LPCVD), may be performed. Thickness Ti of spacer layer 48 may be less than a half of, and may be close to about a third of, pitch P1 of mandrels 46 in some exemplary embodiments.

Figure 4:
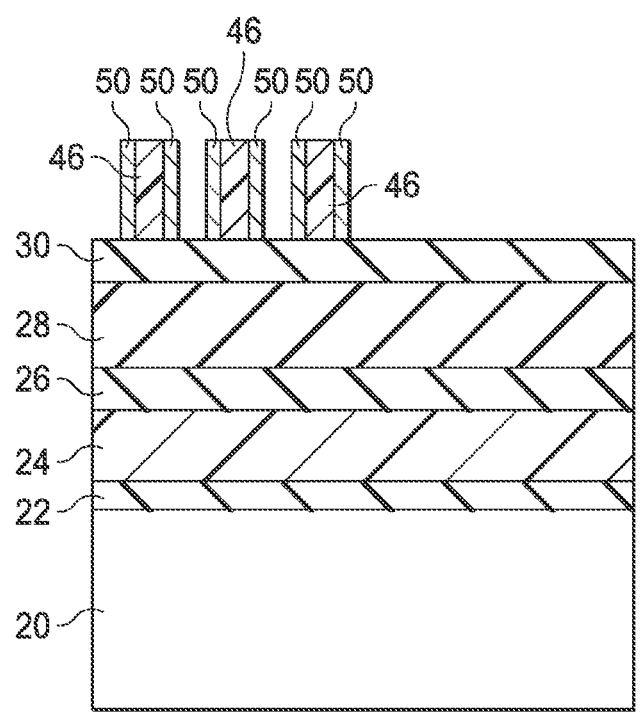
Figure 5:
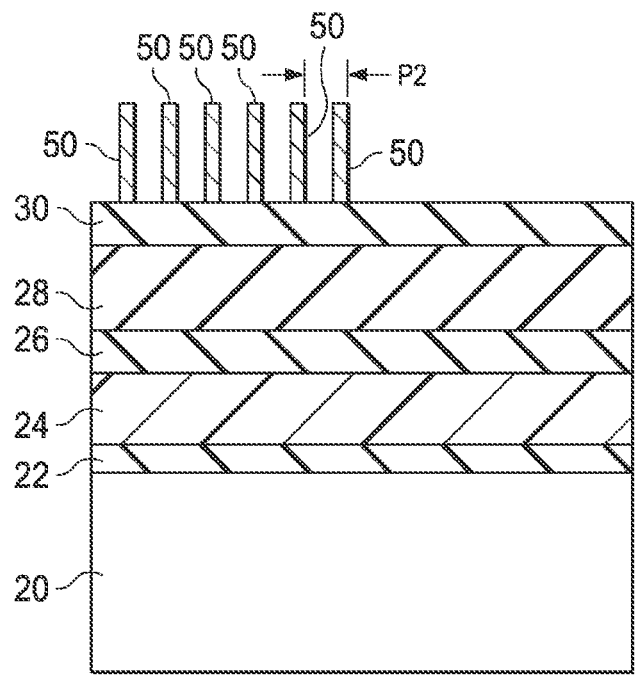

Referring to FIG. 4, the horizontal portions of spacer layer 48 are removed, for example, through an anisotropic etching step. The vertical portions of spacer layer 48 are left, and are referred to as spacers 50 hereinafter. Next, as shown in FIG. 5, mandrels 46 are removed in an etching step, and spacers 50 remain. Pitches P2 of spacers 50 may be a half of pitch P1 in FIG. 1. In some embodiments, pitch P2 is smaller than the minimum pitch.

Figure 6:
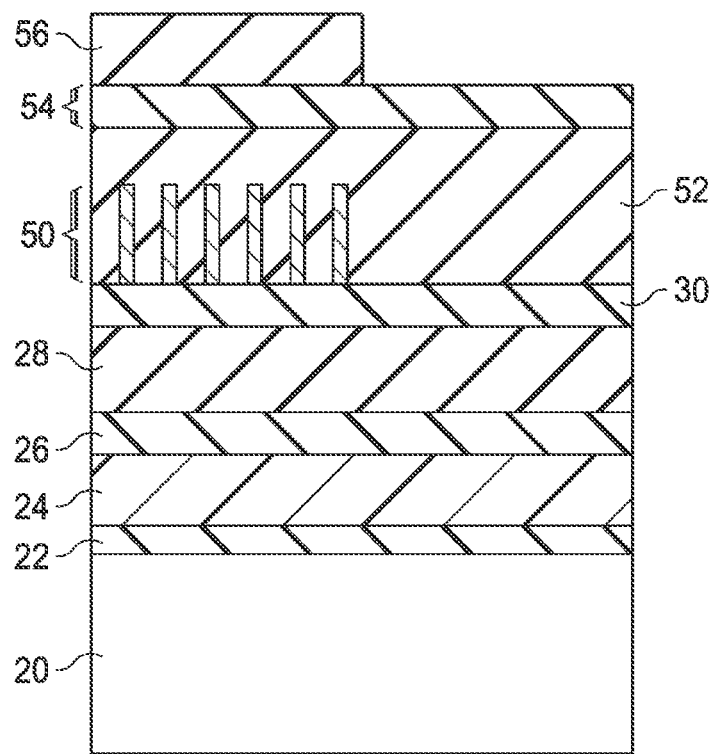

FIGS. 6 through 8B illustrate the first patterning process of spacers 50. Referring to FIG. 6, bottom layer 52 is formed over spacers 50. Bottom layer 52 may contain a photo resist. Middle layer 54 is then formed over bottom layer 52. Middle layer 54 may be formed of an oxide-like photo resist, although other materials may be used. Bottom layer 52 and middle layer 54 may be formed using spin-on coating. Following the formation of middle layer 54, photo resist 56 is formed and patterned.

Figure 7A:
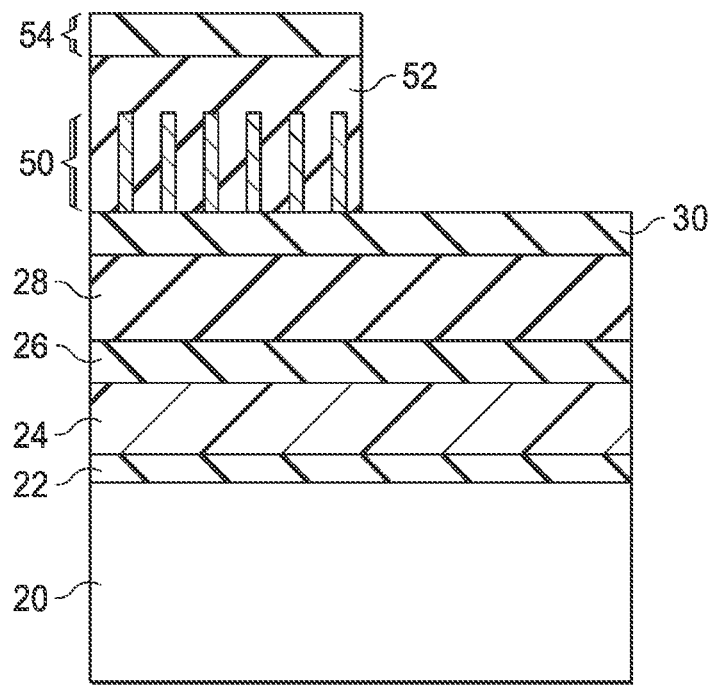
Figure 7B:
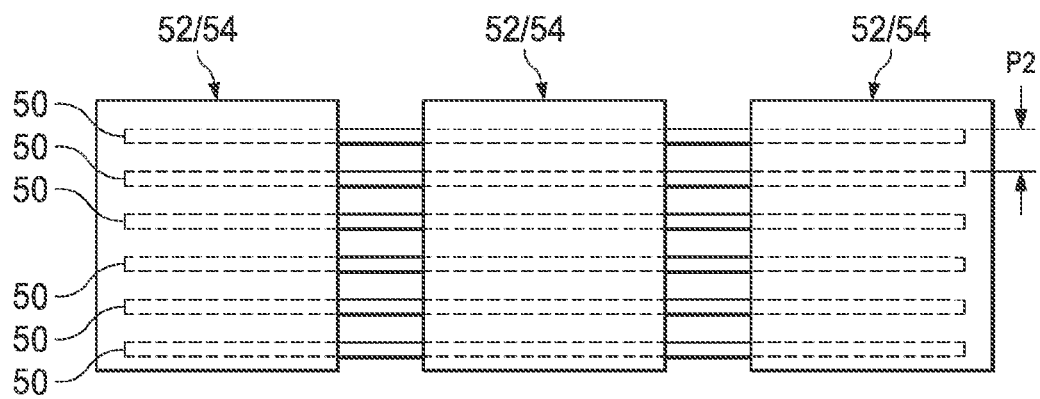

Middle layer 54 and bottom layer 52 are patterned according to the pattern of photo resist 56. Photo resist 56 is then removed. The resulting structure is shown in FIGS. 7A and 7B. FIG. 7A illustrates a cross-sectional view and FIG. 7B illustrates a top view. It is illustrated that spacers 50 include a plurality of strips that are parallel to each other. The strips 50 may have a uniform pitch P2. The patterned bottom layer 52 and middle layer 54 form masks that cover portions of spacers 50, while some other portions of spacers 50 are not covered.

Figure 8A:
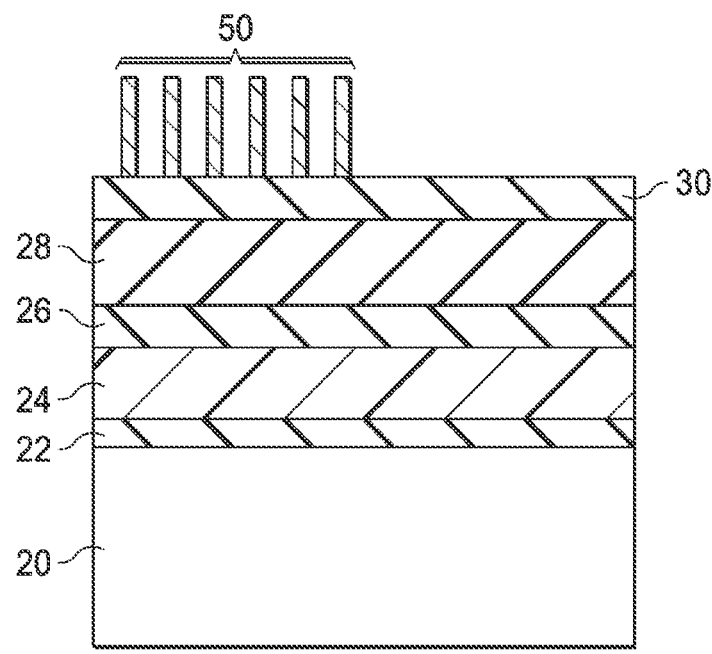
Figure 8B:
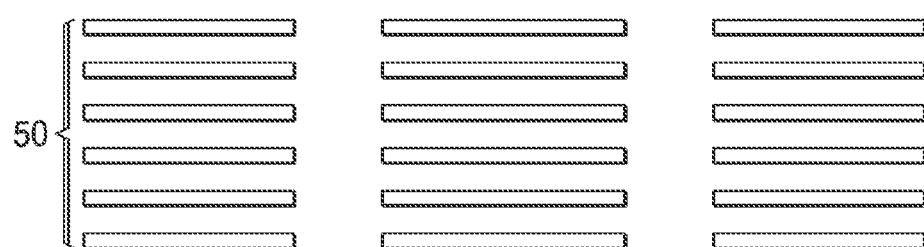

In FIGS. 8A and 8B, which are a cross-sectional view and a top view, respectively, the exposed portions of spacers 50 that are not covered by bottom layer 52 and middle layer 54 are removed. Accordingly, spacers 50 are cut into a plurality of separate shorter strips. Bottom layer 52 and middle layer 54 are then removed.

Figure 9:
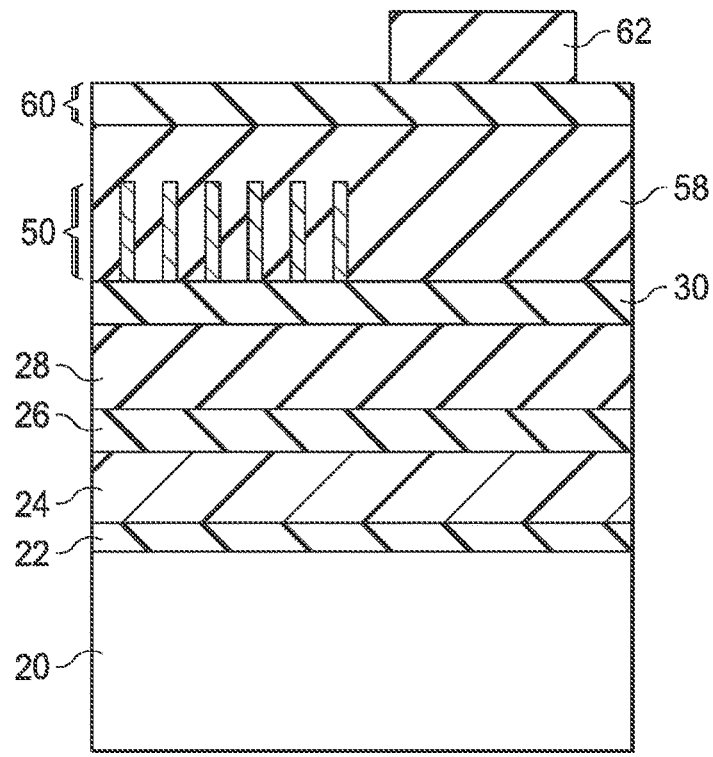
Figure 10:
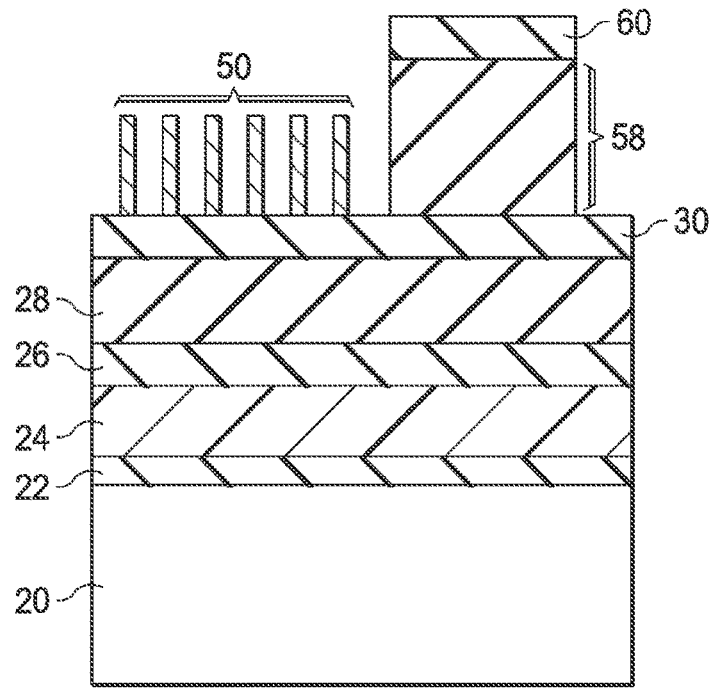
Figure 11:
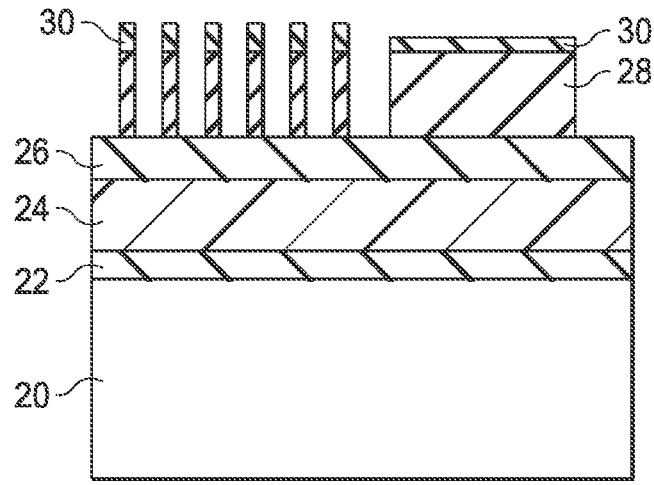

FIGS. 9 and 10 illustrate the patterning of an additional pattern that is used to etch substrate 20, which pattern may have a greater width than the widths of spacers 50. Referring to FIG. 9, bottom layer 58 and middle layer 60 are formed, and photo resist 62 is formed over layers 58 and 60, and then patterned. Bottom layer 58 and middle layer 60 are then patterned, as shown in FIG. 10. Photo resist 62 is then removed. Next, as shown in FIG. 11, hard mask layer 28 is etched using spacers 50 and the patterned bottom layer 58 and middle layer 60 as an etching mask. The patterns of spacers 50 and the patterned bottom layer 58 and middle layer 60 are thus transferred into hard mask 28.

Figure 12:
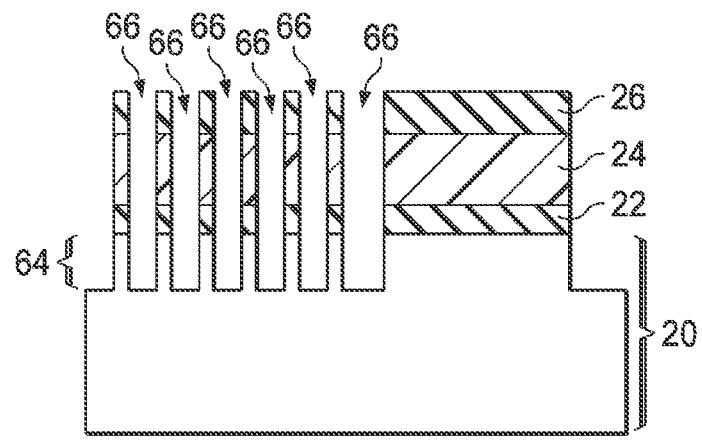

Next, hard mask 28 is used as an etching mask to etch underlying layers including pad oxide layer 22, silicon nitride layer 24, and PE oxide layer 26. Substrate 20 is also etched. Hard mask 28 is then removed, and the resulting structure is shown in FIG. 12. The portions of substrate 20 underlying spacers 50 (FIG. 10) form semiconductor fins 64. Recesses 66 are also formed in substrate 20, and separate semiconductor fins 64 from each other. Semiconductor fins 64 include two edge fins, and inner fins between the edge fins. The inner fins 64 have substantially the same width W2 (critical dimension, also see width W2 in FIG. 23) as the edge fins 64. Furthermore, the profiles of the inner fins 64 are substantially the same as that of edge fins 64, wherein the profiles may include for example, shapes, the tilt angles of edges, and the like.

Figure 13:
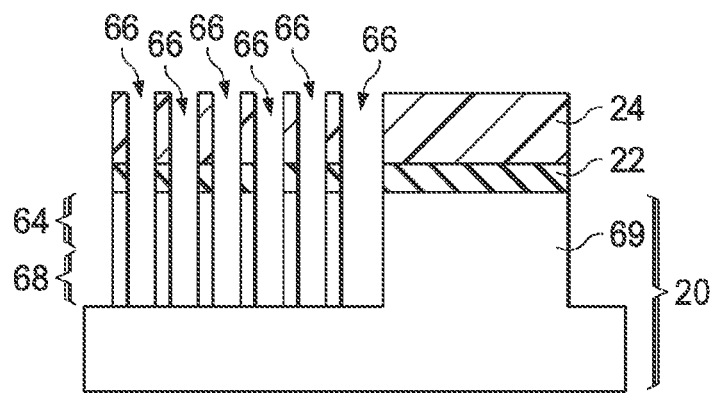

Next, as shown in FIG. 13, substrate 20 is further etched to extend recesses 66 downwardly. This step may be referred to as Shallow Trench Isolation (STI) etching since the extended portions of recesses 66 that are formed in this step will be filled to form STI regions later, while the portions of fins 64 formed in the step in FIG. 12 may be used to form the fins of FinFETs. The portions of substrate 20, which form strips between the extended portions of recesses 66, are referred to as fin extensions 68 hereinafter, although fin extensions 68 are also parts of fins. At the same time fins 64 and fin extensions 68 are formed, large active region 69 is also formed.

Figure 14:
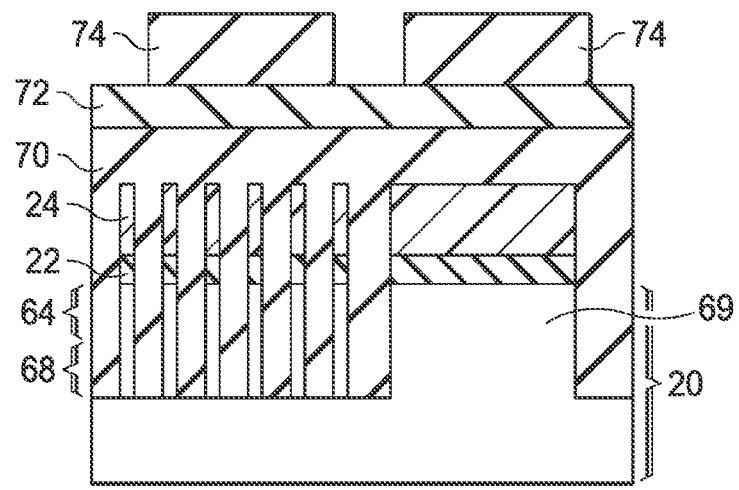
Figure 15:
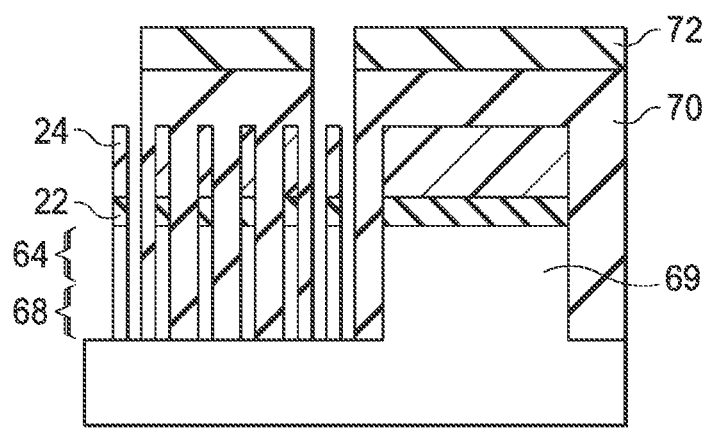

FIGS. 14 through 17B illustrate second patterning process for the further patterning of fins 64. In FIG. 14, bottom layer 70 and middle layer 72 are formed, followed by the formation and the patterning of photo resist 74. Bottom layer 70 may be formed of a material similar to the material of bottom layer 52 (FIG. 6). Middle layer 72 may also be formed of a material similar to the material of middle layer 54. Next, as shown in FIG. 15, photo resist 74 is used as an etching mask to pattern bottom layer 70 and middle layer 72. In some embodiments, the patterned bottom layer 70 and middle layer 72 overlap large active region 69 and a first plurality of fins 64, and do not overlap a second plurality of fins 64. Photo resist 74 is then removed.

Figure 16A:
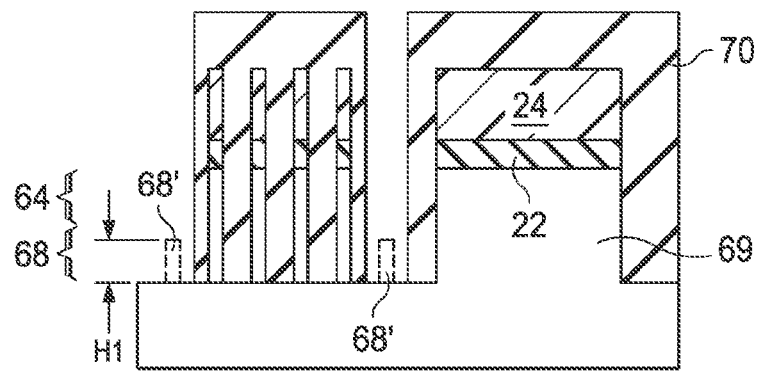
Figure 16B:
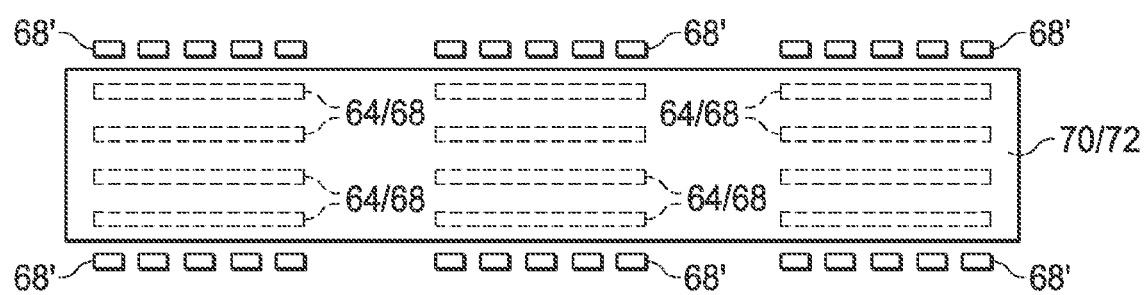
Figure 17A:
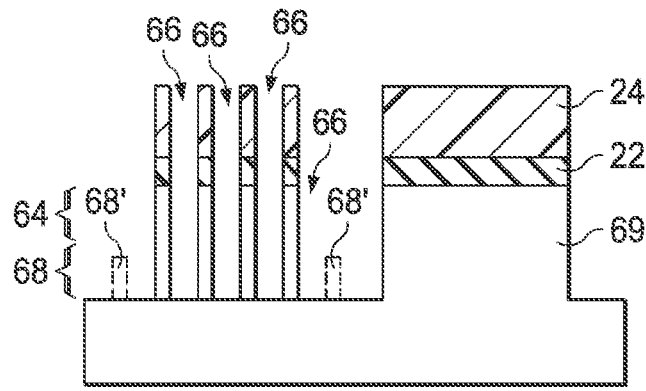
Figure 17B:
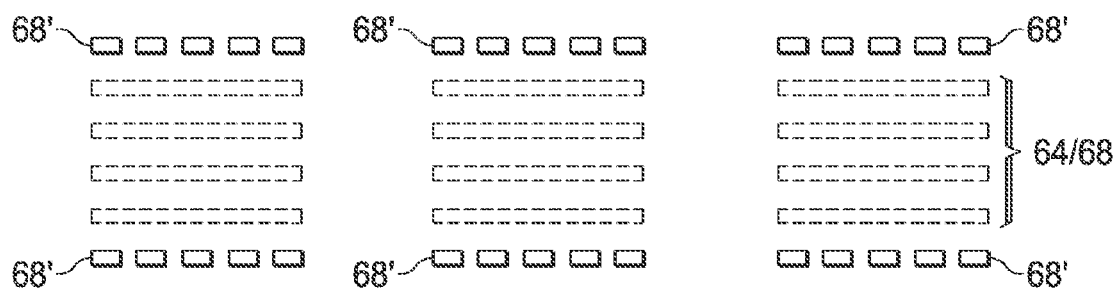

Next, as shown in FIG. 16A, the second plurality of fins 64 is removed, and the first plurality of fins 64 remains un-removed. In some embodiments, some bottom portions of fin extensions 68 also remain, and are referred to as fin extension residues 68' hereafter. The height Hi of the remaining fin extension residues 68' may be greater than about 50 Å in some embodiments, although height Hi may also be greater or smaller. FIG. 16B illustrates a top view of the structure shown in FIG. 16A, wherein fin extension residues 68' are illustrated using dashed lines. Next, as shown in FIGS. 17A and 17B, which illustrate a cross-sectional view and a top view, respectively, the patterned bottom layer 70 and middle layer 72 are removed.

Figure 18:
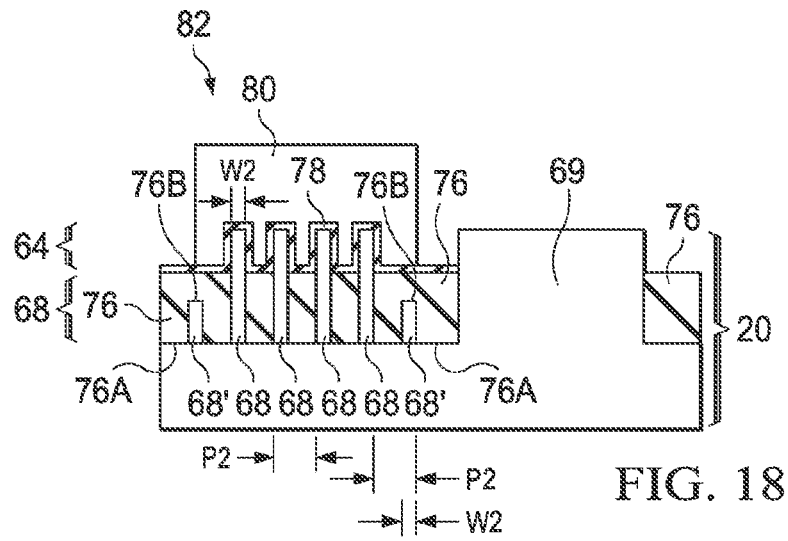
Figure 19:
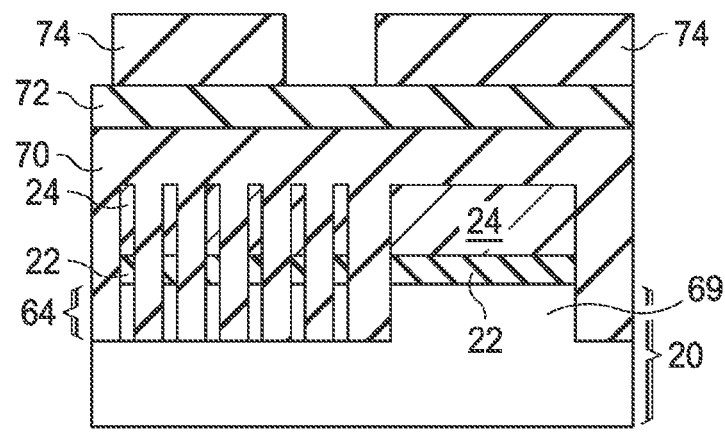
FIGS. 19 through 24B are cross-sectional views of intermediate stages in the manufacturing of FinFETs in accordance with some alternative embodiments.

Referring to FIGS. 18, isolation regions such as STI regions 76 are filled into recesses 66, and then recessed. A Chemical Mechanical Polish (CMP) is performed to level the top surface of STI regions 76. STI regions 76 have bottom surfaces 76A substantially level with each other. Fin extension residues 68' may extend into edge STI regions 76 from the bottom surfaces of the edge STI regions 76. Furthermore, the top surfaces of fin extension residues 68' may contact bottom surfaces 76B of the edge STI region 76. The remaining portions of layers 22 and 24 are also removed.

As also shown in FIG. 18, FinFET 82 is formed on fins 64. FinFET 82 includes gate dielectric 78 and gate electrode 80. In the resulting structure, it is observed that fin extension residues 68' extend up into edge STI regions 76, and are encircled by edge STI regions 76. It is also observed that pitch P2 of fin extension residues 68' and its neighboring fin 64 may be the same as pitch P2 between neighboring fin extensions 68. Furthermore, widths W2 of fin extensions 68 may be substantially the same as widths W2 of fin extension residues 68'.

FIGS. 19 through 24B illustrate cross-sectional views of intermediate stages in the formation of fins and FinFETs in accordance with alternative embodiments. Unless specified otherwise, the materials and formation methods of the components in these embodiments are essentially the same as the like components, which are denoted by like reference numerals in the embodiments shown in FIGS. 1 through 18. The formation details of the embodiments shown in FIGS. 19 through 24B may thus be found in the discussion of the embodiments shown in FIGS. 1 through 18.

Figure 20:
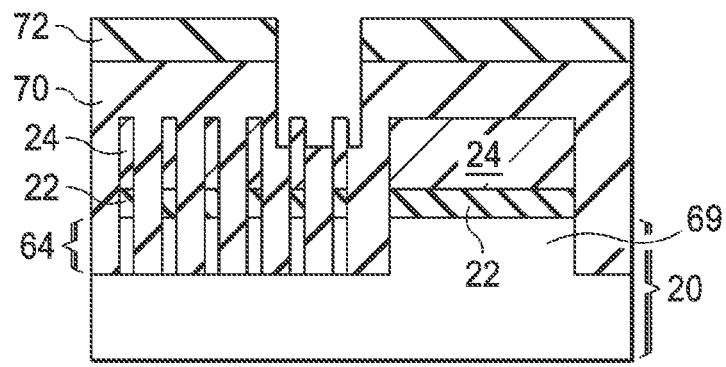
Figure 21:
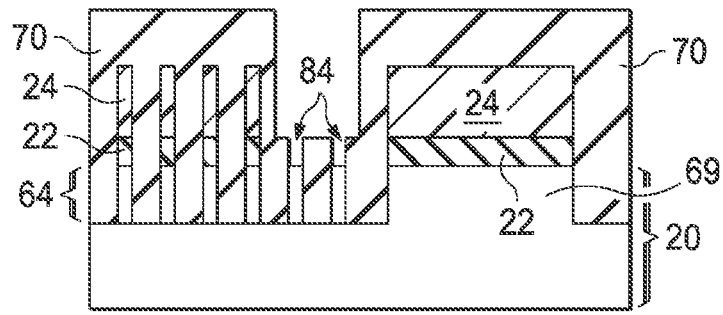
Figure 22:
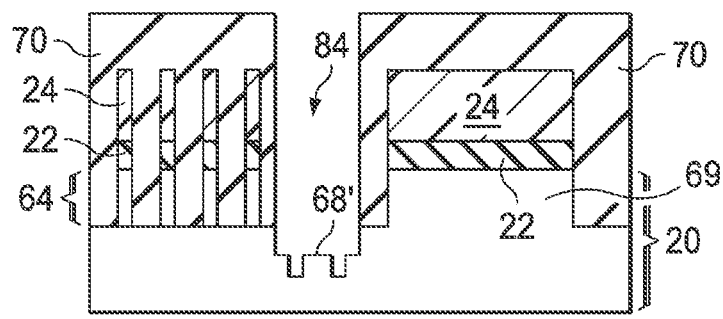

The initial steps of these embodiments are essentially the same as shown in FIGS. 1 through 12. In a subsequent step as in FIG. 19, the STI etch as shown in FIG. 13 is skipped. Instead, bottom layer 70 and middle layer 72 are formed, followed by the formation of photo resist 74. Next, as shown in FIG. 20, photo resist 74 is used as an etching mask to pattern bottom layer 70 and middle layer 72. In some embodiments, the patterned bottom layer 70 and middle layer 72 overlap large active region 69 and a first plurality of fins 64, and do not overlap a second plurality of fins 64. Photo resist 74 is then removed. In subsequent steps as shown in FIGS. 20 and 21, bottom layer 70 and middle layer 72 are used as an etching mask to etch portions of layers 22 and 24 that are not covered, until the second plurality of fins 64 is exposed. Next, as shown in FIGS. 21 and 22, the second plurality of fins 64 is etched. In some embodiments, at the same time the second plurality of fins 64 is etched, bottom layer 70 and middle layer 72 are also etched, so that recess 84 is formed in substrate 20. Bottom layer 70 and middle layer 72 are then removed, and the resulting structure is shown in FIG. 23.

Figure 23:
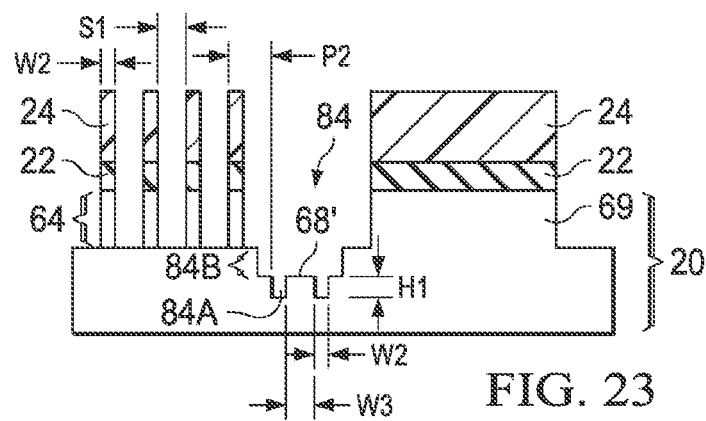

Referring to FIG. 23, fin extension residue 68' is formed as a resulting of the etching, and extends into recess 84 from bottom. Recess 84 includes portions 84A on opposite sides of fin extension residue 68'. Recess 84 further includes portion 84B over and joined to portions 84A, wherein the bottom surface of portion 84B is higher than the bottom surface of portions 84A. One of recess portions 84A may have pitch P2 from the nearest fin 64, which pitch may be the same as the pitch P2 of fins 64. Furthermore, the width W2 of recess portions 84A may be substantially the same as the width W2 of fins 64. In Addition, width W3 of fin extension residue 68' may be substantially the same as fin spacing S1 between fins 64.

Figure 24A:
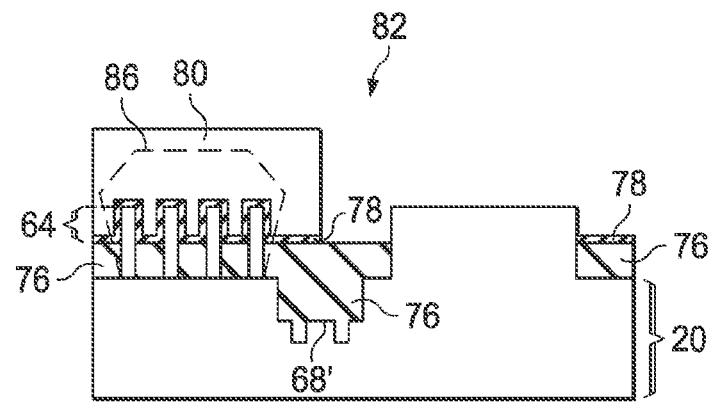

FIG. 24A illustrates the formation of FinFET 82, and the corresponding gate dielectric 78 and gate electrode 80. STI region 76 is also formed in recess 84 and then recessed. In the source and drain regions of FinFET 82, the epitaxially grown semiconductor region 86 merge with each other to form a crown-shaped region 86.

Figure 24B:
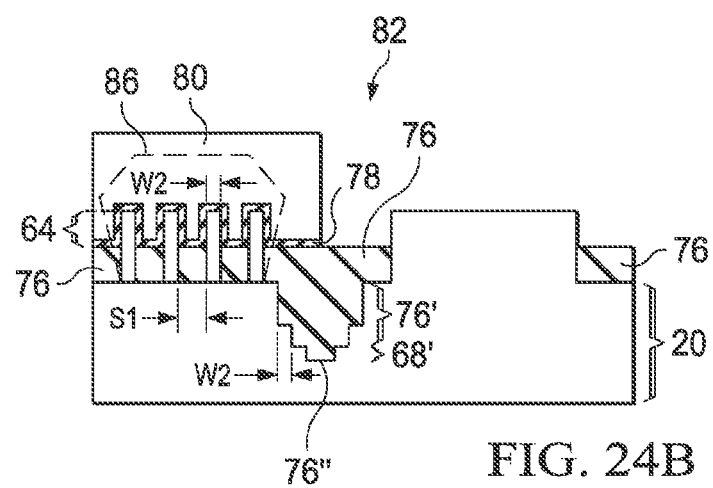

FIG. 24B illustrates FinFET 82 in accordance with alternative embodiments, wherein STI portions 76" (and the corresponding STI regions) are formed between fin extension residues 68'. STI portion 76" has a first bottom surface, whose bottom surface is lower than the bottom surface of STI portion 76'.

In FIGS. 18, 24A, and 24B, it is observed that STI regions 76 have non-flat bottom surfaces. Furthermore, the topography of the bottom surfaces of STI regions 76 reflects the patterns of spacers 50 (FIG. 5). Accordingly, the spacings and the widths of some portions of STI regions 76 are the same as the spacings and widths (such as S1, W2, W3, and the like), of respective spacers 50.

By using the embodiments, the semiconductor fins are patterned after their formation. Accordingly, since the dense and isolation regions, which are the results of the patterning, occur after the formation of fins 64, the pattern loading effect is avoided.

In accordance with embodiments, a device includes a semiconductor substrate, and a plurality of semiconductor fins parallel to each other, wherein the plurality of semiconductor fins is a portion of the semiconductor substrate. An STI region is on a side of the plurality of semiconductor fins. The STI region has a top surface and a non-flat bottom surface, wherein the plurality of semiconductor fins is over the top surface of the STI region.

In accordance with other embodiments, a device includes a semiconductor substrate, a plurality of STI regions in the semiconductor substrate, and a plurality of semiconductor fins parallel to each other and in the semiconductor substrate. A plurality of fin extensions is disposed underlying and aligned to the plurality of semiconductor fins, wherein the plurality of STI regions is disposed between the plurality of fin extensions. An edge STI region is disposed on a side of the plurality of fin extensions, wherein the edge STI region has a first bottom surface substantially level with bottom surfaces of the plurality of STI regions, and a second bottom surface higher than the first bottom surface. A fin extension residue has a bottom substantially level with bottoms of the plurality of fin extensions, wherein the fin extension residue extends into the edge STI region. A top surface of the fin extension residue is in contact with the second bottom surface of the edge STI region.

In accordance with yet other embodiments, a method includes forming a patterned mask including a plurality of strips, and etching a semiconductor substrate underlying the patterned mask to form a first and the second plurality of semiconductor fins. The patterned mask is used as an etching mask. The method further includes etching the second plurality of semiconductor fins without etching the first plurality of semiconductor fins. A recess is formed in the semiconductor substrate by the step of etching the second plurality of semiconductor fins. The recess is filled with a dielectric material to form an isolation region, wherein the first plurality of semiconductor fins is over a top surface of the isolation region.

In accordance with other embodiments, a method includes forming a plurality of semiconductor fins extending from a semiconductor substrate. A masking layer is formed over the plurality of semiconductor fins. The masking layer is patterned to form a patterned mask, the patterned mask exposing a first group of fins of the plurality of semiconductor fins, a second group of fins of the plurality of semiconductor fins remaining masked by the patterned mask. The first group of fins is removed to form a recess in the semiconductor substrate, the recess having a first depth. The patterned mask is removed. An isolation material is deposited in the recess.

In accordance with yet other embodiments, a method of forming a semiconductor device includes forming patterned mask over a first fin and a second fin separated by a first trench, the first trench having a first depth, where a second trench is interposed between a third fin and the second fin, the third fin being exposed. The third fin is removed forming a third trench. An isolation material is formed in the first trench and the third trench, where a thickness of the isolation material in the third trench is greater than a thickness of the isolation material in the first trench.

In accordance with still other embodiments, a device includes a first fin structure extending from a substrate, the first fin structure having a first height. The device also includes a second fin structure extending from the substrate, the second fin structure having a second height that is different from the first height, where the second fin structure is directly adjacent the first fin structure and extends lengthwise parallel to the first fin structure. The device further includes an isolation structure extending from the first fin structure to the second fin structure and extending over a top surface of the second fin structure, where a top portion of the first fin structure extends above the top surface of the isolation structure. The device also includes a gate structure disposed over the first fin structure, the gate structure including a gate dielectric and a gate electrode over the gate dielectric.

In accordance with still other embodiments, a device includes a first set of semiconductor fins protruding vertically from a first depth of a semiconductor substrate, and a second semiconductor fin protruding vertically from a second depth of the semiconductor substrate, the second depth being deeper than the first depth, an upper surface of the second semiconductor fin having a third depth, the third depth being deeper than the first depth. The device also includes an isolation structure disposed between fins of the first set of semiconductor fins and over the second semiconductor fin. The device further includes a gate structure disposed over the first set of semiconductor fins, the gate structure including a gate dielectric and a gate electrode over the gate dielectric.

In accordance with still other embodiments, a device includes a first semiconductor fin and a second semiconductor fin, each having an upper surface level with a top surface of a first active region of a semiconductor substrate, the first semiconductor fin and the second semiconductor fin each having a first height, the first height being a distance from the upper surface to a bottom of a gap between the first semiconductor fin and the second semiconductor fin, the first semiconductor fin having a first width corresponding to a crosswise distance between sidewalls of the first semiconductor fin. The device also includes an isolation structure, a first portion of the isolation structure disposed between the first semiconductor fin and the second semiconductor fin, a second portion of the isolation structure interposed between the first semiconductor fin and the first active region, the first portion of the isolation structure having a first thickness, the second portion of the isolation structure having varying thicknesses in stepped protrusions into the semiconductor substrate. The device further includes a gate structure disposed over the first semiconductor fin and the second semiconductor fin, the gate structure including a gate dielectric and a gate electrode over the gate dielectric.

Another embodiment is a device including a plurality of fins extending from a semiconductor substrate, each fin of the plurality of fins separated by a plurality of first trenches, each trench of the plurality of first trenches having a first depth corresponding to a height of an adjacent fin of the plurality of fins, a first width corresponding to a distance between an outer side of a first fin of the plurality of fins and an outer side of a second fin of the plurality of fins. The device also includes a first recess below and adjacent to the first fin in the semiconductor substrate the first recess having a second depth extending deeper than the first depth, where an upper portion of the first recess is wider than a lower portion of the first recess, where the lower portion of the first recess has a width corresponding to the first width. The device also includes an isolation material disposed in the first recess and extending above the first recess. In an embodiment, the isolation material is further disposed between the first fin and the second fin, where a first portion of the isolation material extending from an upper surface of the isolation material into the first recess has a first thickness, where a second portion of the isolation material between the first fin and the second fin has a second thickness, where the first thickness is greater than the second thickness, where a third portion of the isolation material between the first fin and the first recess has a third thickness, and where the third thickness is the same as the second thickness. In an embodiment, an upper surface of the first portion of the isolation material is level with an upper surface of the second portion of the isolation material. In an embodiment, the first thickness is greater than the first depth. In an embodiment, the isolation material is thickest at a center of the first recess. In an embodiment, the first recess has flat sidewalls. In an embodiment, the flat sidewalls of the first recess include a first portion and a second portion, the first portion over the second portion, where the first portion is laterally separated from the second portion.

Another embodiment is a device including a first fin and a second fin separated by a first trench in a substrate, the first trench having a first depth. The device also includes a second trench in the substrate adjacent the first fin, the second trench having a second depth, the second depth being the same as the first depth. The device also includes a third trench in the substrate adjacent the second trench, the third trench having a third depth, the third depth being greater than the second depth. The device also includes an isolation material in the first trench, the second trench, and the third trench, where a thickness of the isolation material in the third trench is greater than a thickness of the isolation material in the second trench, and where the isolation material extends continuously from the second trench to the third trench. The device also includes a gate dielectric over the first fin and over the second fin. The device also includes a gate electrode over the gate dielectric, where the gate electrode extends from the second fin horizontally over the isolation material in the second trench and the third trench, and where the gate electrode extending horizontally from the second fin over the isolation material in the second trench and the third trench has a uniform thickness. In an embodiment, the isolation material in the first trench has a same material composition as the isolation material in the third trench. In an embodiment, the device also includes an epitaxial structure over a source/drain region of the first fin and over a source/drain region of the second fin. In an embodiment, an upper surface of the isolation material in the first trench is level with an upper surface of the isolation material in the third trench. In an embodiment, the device also includes a fourth trench disposed on a side of the second fin opposite the third trench, the third trench and the fourth trench each having the same depth. In an embodiment, a thickness of the isolation material in the fourth trench is the same as the thickness of the isolation material in the third trench.

Another embodiment is a device including a first fin structure extending from the substrate, the first fin structure including two adjacent fins, the two adjacent fins separated by a first distance. The device also includes a substrate depression in the substrate, where the substrate depression has a first width in a first dimension and a second width in the first dimension, the first width being greater than the second width, the first width corresponding to a combined width of the two adjacent fins of the first fin structure and the first distance, where a first end of the first width corresponds to a first sidewall of the substrate depression, where a second end of the first width opposite the first end corresponds to a second sidewall of the substrate depression opposite the first sidewall. The device also includes an isolation structure extending from the first fin structure into the substrate depression, where a portion of the first fin structure extends above a top surface of the isolation structure. The device also includes a gate structure over the first fin structure, the gate structure including a gate dielectric and a gate electrode over the gate dielectric. In an embodiment, the gate structure overlaps the substrate depression in a plan view. In an embodiment, the substrate depression is interposed between an active region and the first fin structure, where after depositing the isolation structure, a lateral extent of the isolation structure corresponds to a sidewall of the active region. In an embodiment, the second fin structure is directly adjacent the substrate depression on a side opposite to the substrate depression from the first fin structure. In an embodiment, the substrate depression has a first portion having a first depth and a second portion having a second depth, where the second depth is greater than the first depth. In an embodiment, the substrate depression is a first substrate depression, further including a second substrate depression, where the first fin structure is interposed between the first substrate depression and the second substrate depression. In an embodiment, the first substrate depression and the second substrate depression each have the same depth.

Another embodiment is a device including a plurality of semiconductor fins extending vertically from a substrate, where a combined distance of a width of a first fin of the plurality of semiconductor fins, a width of a second fin of the plurality of semiconductor fins, and a distance between the first fin and the second fin is a first distance, the first fin adjacent the second fin. The device also includes a first isolation structure disposed between the first fin and the second fin. The device also includes a second isolation structure adjacent to the first fin, the second isolation structure thicker than the first isolation structure, a lower portion of the second isolation structure protruding down into the substrate, the lower portion of the second isolation structure having a protrusion width corresponding to the first distance. In an embodiment, an upper surface of the first isolation structure is level with an upper surface of the second isolation structure. In an embodiment, the device may include a gate structure disposed over the first fin and the second fin and extending along an upper surface of the second isolation structure, the gate structure overlapping the lower portion of the second isolation structure. In an embodiment, a thickness of the first isolation structure is less than a thickness of the second isolation structure. In an embodiment, the lower portion of the second isolation structure is spaced from the first fin by a multiple of a pitch between the first fin and the second fin. In an embodiment, the lower portion of the second isolation structure has vertical sidewalls. In an embodiment, the second isolation structure is interposed between the first fin and an active region of the substrate.

Another embodiment is a device including a semiconductor substrate. The device also includes a plurality of semiconductor fins parallel to each other and extending from the semiconductor substrate. The device also includes a first isolation region disposed between adjacent ones of the plurality of semiconductor fins. The device also includes a second isolation region on a side of the plurality of semiconductor fins, where the second isolation region may include a first bottom surface substantially level with a bottom surfaces of the first isolation region, and a second bottom surface higher than the first bottom surface. The device also includes a fin residue having a bottom substantially level with bottoms of the plurality of semiconductor fins, where the fin residue extends into the second isolation region, and where a top surface of the fin residue is in contact with the second bottom surface of the second isolation region. In an embodiment, the fin residue and a nearest one of the plurality of semiconductor fins have a pitch substantially equal to a pitch of the plurality of semiconductor fins. In an embodiment, the fin residue is a first fin residue, may include a second fin residue disposed on an opposite side of the plurality of semiconductor fins than the first fin residue. In an embodiment, the second isolation region encircles the plurality of semiconductor fins, in top down view. In an embodiment, the fin residue has a width substantially equal to a width of one of the plurality of semiconductor fins. In an embodiment, an upper surface of the first isolation region is substantially level with an upper surface of the second isolation region. In an embodiment, the fin residue is disposed between the plurality of semiconductor fins and an active region of the semiconductor substrate. In an embodiment, the device may include a gate structure overlying upper surfaces of the plurality of semiconductor fins. In an embodiment, the gate structure overlaps the fin residue.

Another embodiment is a device including a first fin and a second fin protruding vertically from a substrate, the first fin and the second fin separated by a first distance. The device also includes an isolation structure extending from the first fin into a recess of the substrate, where a portion of the isolation structure in the recess has a first width, the first width corresponding to a combined width of the first fin, width of the second fin, and the first distance, where a first end of the first width corresponds to a first sidewall of the recess, where a second end of the first width opposite the first end corresponds to a second sidewall of the recess opposite the first sidewall. The device further includes a gate structure over the first fin and the second fin, the gate structure may include a gate dielectric and a gate electrode over the gate dielectric. In an embodiment, the gate structure extends to a position which is directly over a portion of the recess. In an embodiment, the recess is a distance from the first fin corresponding to the first distance. In an embodiment, the recess has a first portion having a first depth and a second portion having a second depth, where the second depth is greater than the first depth, the second depth at a middle of the recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a plurality of semiconductor fins extending vertically from a substrate, wherein a combined distance of a width of a first fin of the plurality of semiconductor fins, a width of a second fin of the plurality of semiconductor fins, and a distance between the first fin and the second fin is a first distance, the first fin adjacent the second fin;
   a first isolation structure disposed between the first fin and the second fin; and a second isolation structure adjacent to the first fin, the second isolation structure thicker than the first isolation structure, a lower portion of the second isolation structure protruding down into the substrate, the lower portion of the second isolation structure having a protrusion width corresponding to the first distance.

2. The device of claim 1, wherein an upper surface of the first isolation structure is level with an upper surface of the second isolation structure.

3. The device of claim 1, further comprising a gate structure disposed over the first fin and the second fin and extending along an upper surface of the second isolation structure, the gate structure overlapping the lower portion of the second isolation structure.

4. The device of claim 1, wherein a thickness of the first isolation structure is less than a thickness of the second isolation structure.

5. The device of claim 1, wherein the lower portion of the second isolation structure is spaced from the first fin by a multiple of a pitch between the first fin and the second fin.

6. The device of claim 1, further comprising:
an active region extending vertically from the substrate, the second isolation structure disposed between the first fin and the active region, a width of the active region being greater than the width of the first fin and the width of the second fin.

7. A device comprising:
a first semiconductor fin and a second semiconductor fin each extending from a level of a substrate, the first semiconductor fin having a first width, wherein the first semiconductor fin is directly adjacent to the second semiconductor fin, and the first semiconductor fin is separated from the second semiconductor fin by a first distance;
an active region having a second width, the second width being greater than the first width, wherein the active region is directly adjacent to the second semiconductor fin, the active region is separated from the second semiconductor fin by a second distance, and the second distance is greater than the first distance; and
an isolation structure between the active region and the second semiconductor fin, wherein the first semiconductor fin, the second semiconductor fin, and the active region are each protruding from a topmost surface of the isolation structure in a cross-sectional view.

8. The device of claim 7, further comprising:
a semiconductor structure extending from the level of the substrate, the first semiconductor fin having a first height as measured from the level of the substrate, the semiconductor structure having a second height as measured from the level of the substrate, the second height being less than the first height.

9. The device of claim 7, wherein the active region is a fin extending from the level of the substrate.

10. The device of claim 7, further comprising:
an epitaxial region on the first semiconductor fin and the second semiconductor fin.

11. The device of claim 7, further comprising:
a gate structure on the first semiconductor fin and the second semiconductor fin.

12. The device of claim 7, wherein the isolation structure has a third width at a first depth below the level of the substrate and a fourth width at a second depth below the level of the substrate, the fourth width less than the third width, the second depth greater than the first depth.

13. The device of claim 12, wherein the second semiconductor fin has a fifth width, and the fourth width is equal to a sum of the first width, the fifth width, and the first distance.

14. A device comprising:
a first region comprising a first semiconductor fin and a second semiconductor fin each extending from a level of a substrate;
an active region extending from the level of the substrate;
an isolation structure between the active region and the first semiconductor fin, the isolation structure having a first width at a first depth, the isolation structure having a second width at a second depth, the isolation structure having a third width at a third depth, wherein the first width, the second width and the third width are different, wherein the second depth is greater than the first depth, and wherein the third depth is greater than the second depth; and
an epitaxial feature disposed in the first region, the epitaxial feature extending continuously over the first semiconductor fin and the second semiconductor fin.

15. The device of claim 14, further comprising:
a gate structure on the first region.

16. The device of claim 14, wherein the epitaxial feature is raised from a top surface of the first semiconductor fin and from a top surface of the second semiconductor fin.

17. The device of claim 14, wherein the isolation structure comprises a portion in the substrate.

18. The device of claim 14, wherein the first width is greater than the second width, and the second width is greater than the third width.

19. The device of claim 14, wherein the first width of the isolation structure is measured across a first center line, the second width of the isolation structure is measured across a second center line, the third width of the isolation structure is measured across a third center line, and the first center line, the second center line, and the third center line are aligned with one another.

20. The device of claim 14, wherein a top surface of the active region and a top surface of the isolation structure have different heights, relative the level of the substrate.

* * * * *